United States Patent
Jung et al.

(10) Patent No.: US 7,944,291 B2
(45) Date of Patent: May 17, 2011

(54) POWER AMPLIFIER HAVING PARALLEL AMPLIFICATION STAGES AND ASSOCIATED IMPEDANCE MATCHING NETWORKS

(75) Inventors: Joo Min Jung, Seoul (KR); Moon Suk Jeon, Seoul (KR); Sang Hwa Jung, Ansan (KR); Jung Hyun Kim, Ulwang (KR)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 50 days.

(21) Appl. No.: 12/494,414

(22) Filed: Jun. 30, 2009

(65) Prior Publication Data
US 2010/0327969 A1 Dec. 30, 2010

(51) Int. Cl.
*H03F 1/14* (2006.01)
(52) U.S. Cl. .................. 330/51; 330/124 R; 330/302
(58) Field of Classification Search .............. 330/51, 330/124 R, 295, 310, 133, 150, 98
See application file for complete search history.

(56) References Cited

U.S. PATENT DOCUMENTS

| | | |
|---|---|---|
| 6,781,455 B2 | 8/2004 | Kim |
| 6,894,561 B2 | 5/2005 | Apel |
| 6,900,692 B2 | 5/2005 | Kim et al. |
| 7,157,966 B2 | 1/2007 | Baree et al. |
| 7,248,111 B1 | 7/2007 | Xu et al. |
| 7,382,186 B2 | 6/2008 | Apel et al. |
| 7,385,445 B2 * | 6/2008 | Wright .......................... 330/51 |
| 7,388,427 B2 | 6/2008 | Kim et al. |
| 7,436,257 B2 | 10/2008 | Park et al. |
| 7,479,827 B2 | 1/2009 | Hau et al. |
| 7,741,904 B2 * | 6/2010 | Ichitsubo et al. ............. 330/133 |
| 2005/0068101 A1 | 3/2005 | Kim et al. |
| 2005/0083117 A1 | 4/2005 | Kim et al. |
| 2005/0099227 A1 | 5/2005 | Kim et al. |
| 2005/0122165 A1 | 6/2005 | Kim et al. |
| 2007/0222523 A1 | 9/2007 | Arell |

OTHER PUBLICATIONS

Tanoue et al., "Switch-Less-Impedance-Matching Type W-CDMA Power Amplifier With Improved Effciency And Linearity Under Low Power Operation", Microwave Symposium Digest, 2005 IEEE MTT-S International Jun. 12-17, 2005, pp. 665-668.

* cited by examiner

*Primary Examiner* — Hieu P Nguyen

(57) ABSTRACT

An amplification device includes a series combination of a driver stage, an output terminal matching network, and a secondary amplification stage. The driver stage includes a driver amplifier and an output matching network. The secondary amplification stage includes a parallel combination of an impedance transformation network and a main amplification stage. The main amplification stage includes a plurality of main amplification branches in parallel with each other, and an input matching network in series with the parallel combination. Each main amplification branch includes a main amplifier, and input and output impedance matching networks. A control circuit supplies activation signals to the main amplification branches to selectively turn them on and off. The device has no switches in the path of the signal that is amplified. In at least one operating mode, the control circuit turns on at least two of the main amplification branches at the same time.

16 Claims, 8 Drawing Sheets

POWER AMPLIFIER HAVING PARALLEL AMPLIFICATION STAGES AND ASSOCIATED IMPEDANCE MATCHING NETWORKS

BACKGROUND

Power amplifiers are employed in a variety of devices. One class of such devices includes portable, battery-operated, devices, such as mobile telephones. Due to the restricted size and battery capacity of these mobile devices, the current consumption of such devices, and therefore the current consumption of each of the components of such devices, is strictly limited. Furthermore, as additional functions are being integrated into such mobile devices, more components share the limited battery capacity.

Typically, a power amplifier is one of the largest power consuming components of a mobile device, and in some devices such as some mobile telephones, the power amplifier operates full-time. Therefore, it is important that the power amplifier should have a high degree of efficiency, to conserve current consumption and extend the battery life. However, a conventional class AB power amplifier, which is generally used as a power amplifier in a mobile device, exhibits its maximum efficiency only in its maximum output power region. Therefore, many approaches have been tried to provide structures which enhance the efficiency of a power amplifier in low-power regions, but less investigation has been performed to find a way to enhance the efficiency at higher power levels.

Meanwhile, various commercial standards for mobile devices, such as CDMA, GSM, EDGE and WCDMA, each have their own maximum output power specifications. So it is very difficult to satisfy the efficiency requirement for devices complying with each of those standards by using a single power amplifier module. Therefore, a power amplifier in which is possible to modulate its output power level with maximum efficiency in the high power region is required in order to utilize a single power amplifier for several standard applications, as well as to enhance the efficiency and operation time of the mobile device.

Previous power amplifiers have divided their operating power usage into two or more regions in order to enhance the efficiency and achieve a longer operating time. However, because these devices modulate their power modes only either in a low or high power region, they have a limit to enhance power efficiency. Another disadvantage of the prior solutions is that RF switches typically have been utilized for mode switching, which increase performance degradation, structural complexity and production cost. Examples of some these approaches and a discussion of there limitations will now be provided as an illustration.

FIG. 1 is a functional block diagram of one embodiment of an amplification device 10. Amplification device 10 includes: a driver 100 for amplifying input power; a power stage 120 for receiving power amplified by the driver 100 through a first impedance matching unit 130 connected to the driver and a second impedance matching unit 140 connected to the first impedance matching unit 130, reamplifying the power and outputting the reamplified power; an applied voltage control circuit 90, connected to the power stage 120, for controlling applied voltages corresponding to the low power mode and the high power mode; an impedance transformer 170 for receiving power amplified by the driver 100 through the first impedance matching unit 130, according to operations of the applied voltage control circuit 90 and transferring the power to a fourth impedance matching unit 160; a third impedance matching unit 150, connected to the power stage 120 in serial, for transferring power amplified by the power stage 120 to the fourth impedance matching unit 160; and the fourth impedance matching unit 160, connected to the third impedance matching unit 150 and connected to impedance transformer 170, for transferring power, transferred from the third impedance matching unit 150 or impedance transformer 170, to an output stage 80 according to operations of the applied voltage control circuit 90.

Amplification device 10 provides two or three power modes so as to get increased power efficiency. Since the structure does not utilize any RF switches in the signal paths, little performance degradation is shown compared to other multiple power mode power amplifiers. The structure, however, operates at more than 10 dB backed off point from its maximum output power, and therefore power re-configurability and efficiency enhancement in a high power region from about 3 to 6 dB backed off from the maximum output power are not achievable.

FIG. 2 is a functional block diagram of another embodiment of an amplification device 20. Amplification device 20 includes: a switching mechanism 210 configured to receive an input signal (such as an RF input signal ("RF IN")) at an input port 202 and to selectively route the input signal to either a first amplifier 220 or to a second amplifier 230 in response to a switch-control signal. In a first mode of operation selected by the switch-control signal, switching mechanism 210 routes the input signal to first amplifier 220; and, in a second mode of operation, switching mechanism 210 routes the input signal onto a bypass path to second amplifier 230. In either mode, the amplified signal is output at output port 206. In several of the disclosed embodiments, the first amplifier 220 is itself configured to operate in multiple power modes. First amplifier 220 includes matching network 272, preliminary amplifier 270, delay 266, low-power amplifier 240, high-power amplifier 242, impedance inverter 260, and matching network 274. Second amplifier 230 includes matching network 282 and ultra-low power amplifier 280.

Amplification device 20 has a discrete power mode in the higher power region. Despite its potential for enhancing efficiency in the higher power region, its complexity caused by the integration of RF switch 210 and complicated phase matching circuits make it hard to realize high productivity and low production costs.

FIG. 3 is a functional block diagram of yet another embodiment of an amplification device 30. Amplification device 30 includes an input network 310, output stages 330-1~330-N, an output impedance matching network 350, an inter-stage matching network 382, and a bias-control network 370.

Amplification device 30 has discrete power modes for the high power region. However, it is difficult to optimize output matching circuit 350 for each of the respective power modes. Furthermore, by operating merely one of the output stages 330-1~330-N for each power mode, the architecture essentially spends redundant chip area for inactivated output stages when it operates even at the highest power mode, which increases production cost for the device. In addition, since the circuit does not present a reasonable way to reduce current consumption in the low power region, it seems to have a restriction on its ability to enhance overall efficiency.

What is needed, therefore, is a power amplifier that can provide increased efficiency in both low power output regions, and also in high power output regions.

SUMMARY

In an example embodiment, a device comprises: an input terminal; an output terminal; a driver amplifier having an input terminal, and an output terminal, where the input terminal is connected to the input terminal; a first main amplifier having an input terminal and an output terminal, and configured to receive a first activation signal for selectively activating and deactivating the first amplifier; a second main amplifier having an input terminal and an output terminal, and configured to receive a second activation signal for selectively activating and deactivating the second amplifier; a control circuit configured to supply the first and second activation signals to the first and second amplifiers, respectively; a first impedance matching circuit directly connected between the output terminal of the driver amplifier and a first intermediate node; a second impedance matching circuit directly connected between the first intermediate node and a second intermediate node; a third impedance matching circuit directly connected between the second intermediate node and the input terminal of the first main amplifier; a fourth impedance matching circuit directly connected between the second intermediate node and the input terminal of the second main amplifier; a fifth impedance matching circuit directly connected between the output terminal of the first main amplifier and a third intermediate node; a sixth impedance matching circuit directly connected between the output terminal of the second main amplifier and the third intermediate node; an impedance transformation network directly connected between the first intermediate node and the third intermediate node; and a seventh impedance matching circuit directly connected between the third intermediate node and the output terminal.

In another example embodiment, a device comprises: an input terminal; an output terminal; a first impedance matching circuit directly connected between the input terminal and a first intermediate node; a driver amplifier having an input terminal, and an output terminal, and configured to receive a driver amplifier activation signal for selectively activating and deactivating the driver amplifier; a bypass amplifier having an input terminal, and an output terminal, and configured to receive a bypass amplifier activation signal for selectively activating and deactivating the bypass amplifier; a second impedance matching circuit directly connected between the first intermediate node and the input node of the driver amplifier; a third impedance matching circuit directly connected between the first intermediate node and the input node of the bypass amplifier; a first main amplifier having an input terminal and an output terminal, and configured to receive a first activation signal for selectively activating and deactivating the first amplifier; a second main amplifier having an input terminal and an output terminal, and configured to receive a second activation signal for selectively activating and deactivating the second amplifier; a control circuit configured to supply the driver amplifier activation signal to the driver amplifier, to supply the bypass amplifier activation signal to the bypass amplifier, and to supply the first and second activation signals to the first and second amplifiers, respectively; a fourth impedance matching circuit directly connected between the output terminal of the driver amplifier and a second intermediate node; a fifth impedance matching circuit directly connected between the output terminal of the bypass amplifier and the second intermediate node; a sixth impedance matching circuit directly connected between the second intermediate node and a third intermediate node; a seventh impedance matching circuit directly connected between the third intermediate node and the input terminal of the first main amplifier; an eighth impedance matching circuit directly connected between the third intermediate node and the input terminal of the second main amplifier; a ninth impedance matching circuit directly connected between the output terminal of the first main amplifier and a fourth intermediate node; a tenth impedance matching circuit directly connected between the output terminal of the second main amplifier and the fourth intermediate node; an impedance transformation network directly connected between the second intermediate node and the fourth intermediate node; and an eleventh impedance matching circuit directly connected between the fourth intermediate node and the output terminal.

In yet another embodiment, a device for amplifying a signal comprises: a driver amplifier stage including a driver amplifier and a driver amplifier output matching network; a device output terminal matching network; and a secondary amplification stage in series between the driver amplifier stage and the device output terminal matching network. The secondary amplification stage comprises an impedance transformation network, and a main amplification stage in parallel with the impedance transformation network. The main amplification stage includes a plurality of main amplification branches in parallel with each other and a main amplification stage input matching network in series with the plurality of parallel main amplification branches. Each of the main amplification branches includes a main amplifier, an input impedance matching network, and an output impedance matching network. A control circuit is configured to supply activation signals to each of the main amplification branches to selectively turn on and off the main amplification branches. The device has no switches in the path of the signal that is amplified, and in at least one operating mode, the control circuit is configured to turn on at least two of the main amplification branches at a same time.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions shown in the drawings may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

Figure 1:
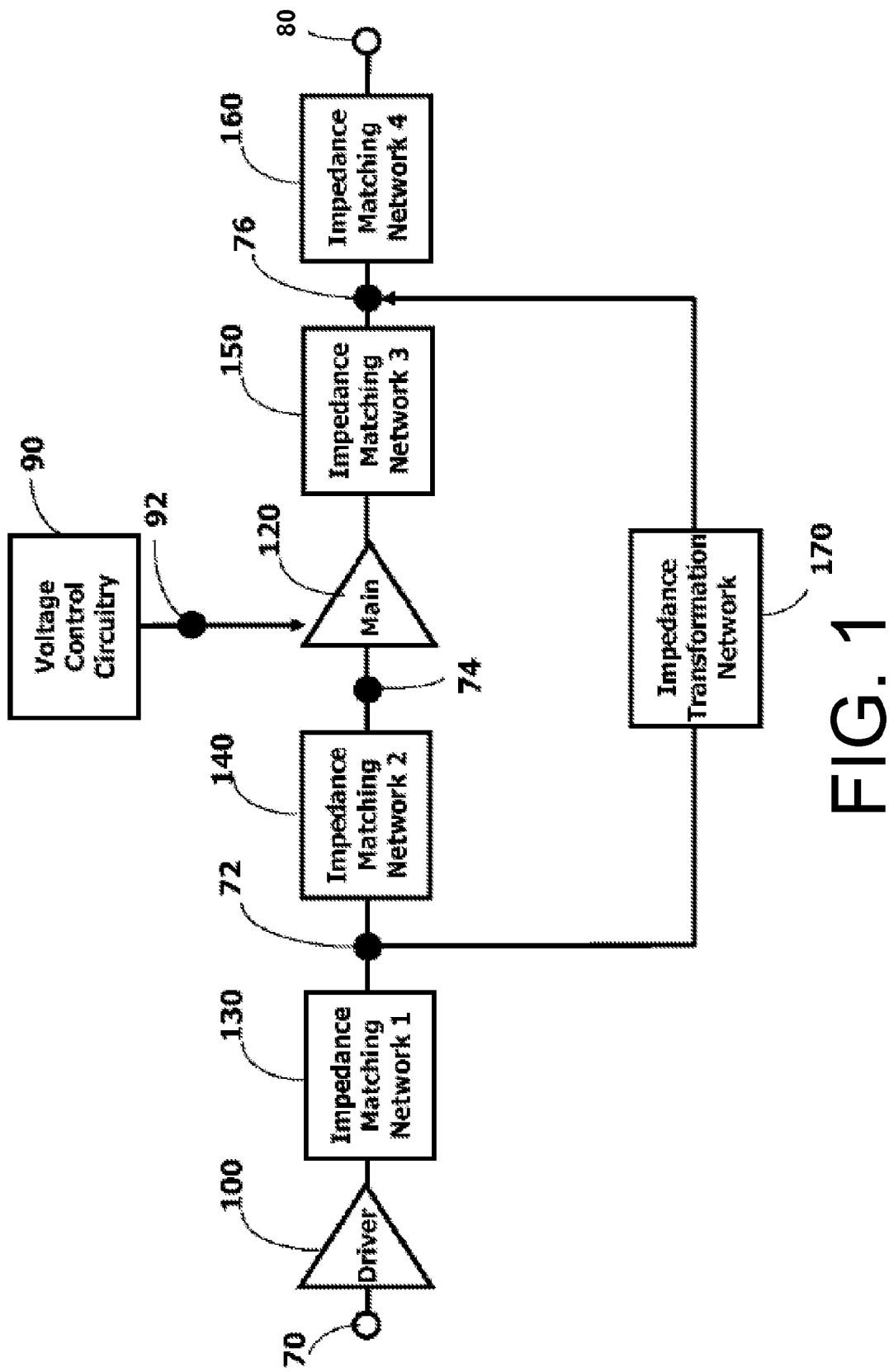
FIG. 1 is a functional block diagram of one known amplification device.
Figure 2:
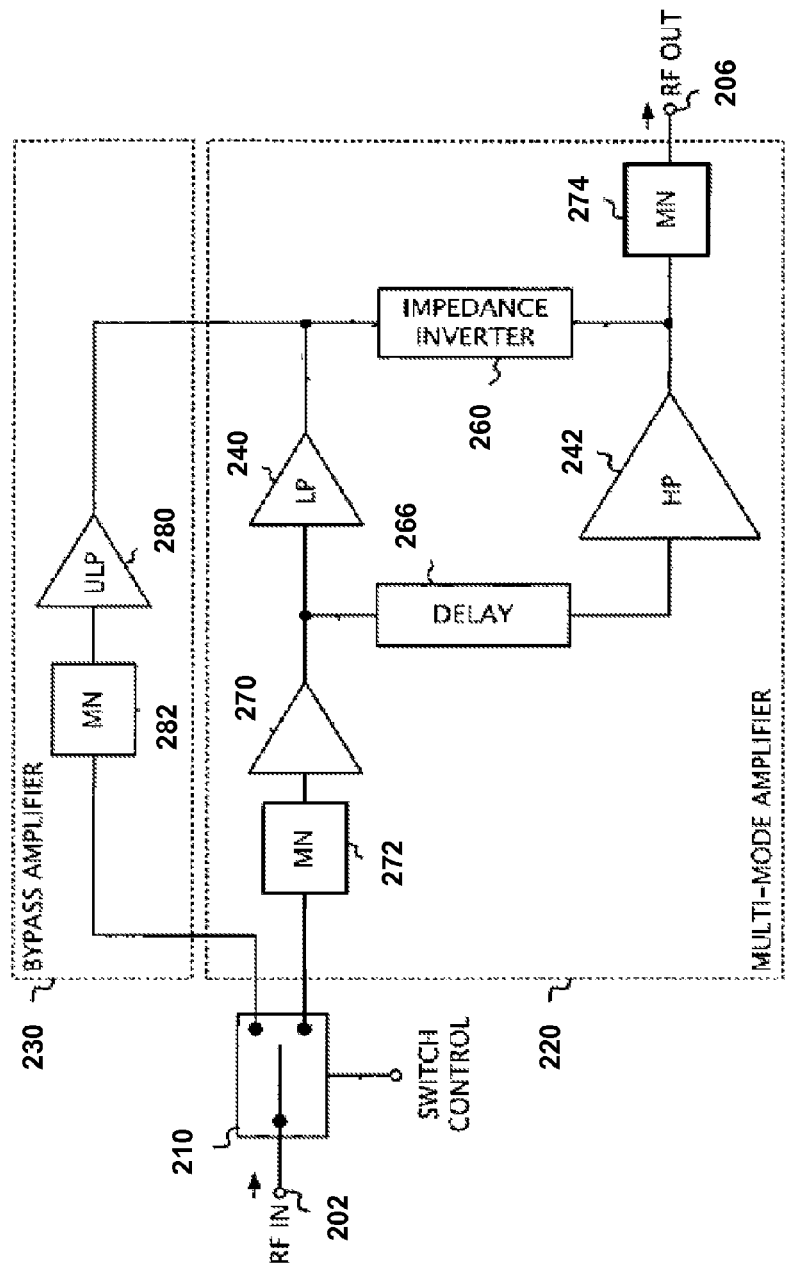
FIG. 2 is a functional block diagram of another known amplification device.
Figure 3:
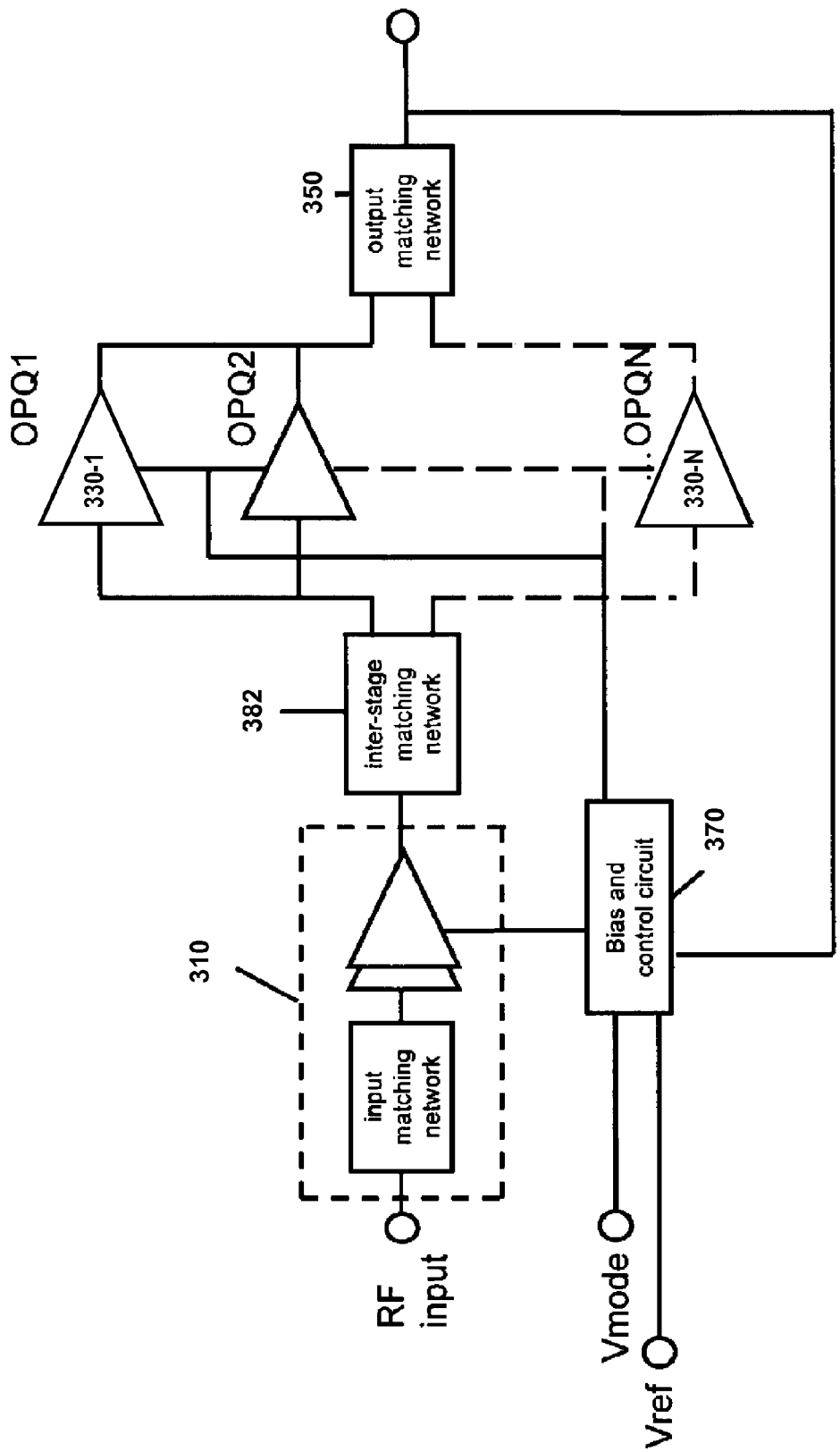
FIG. 3 is a functional block diagram of yet another known amplification device.
Figure 4:
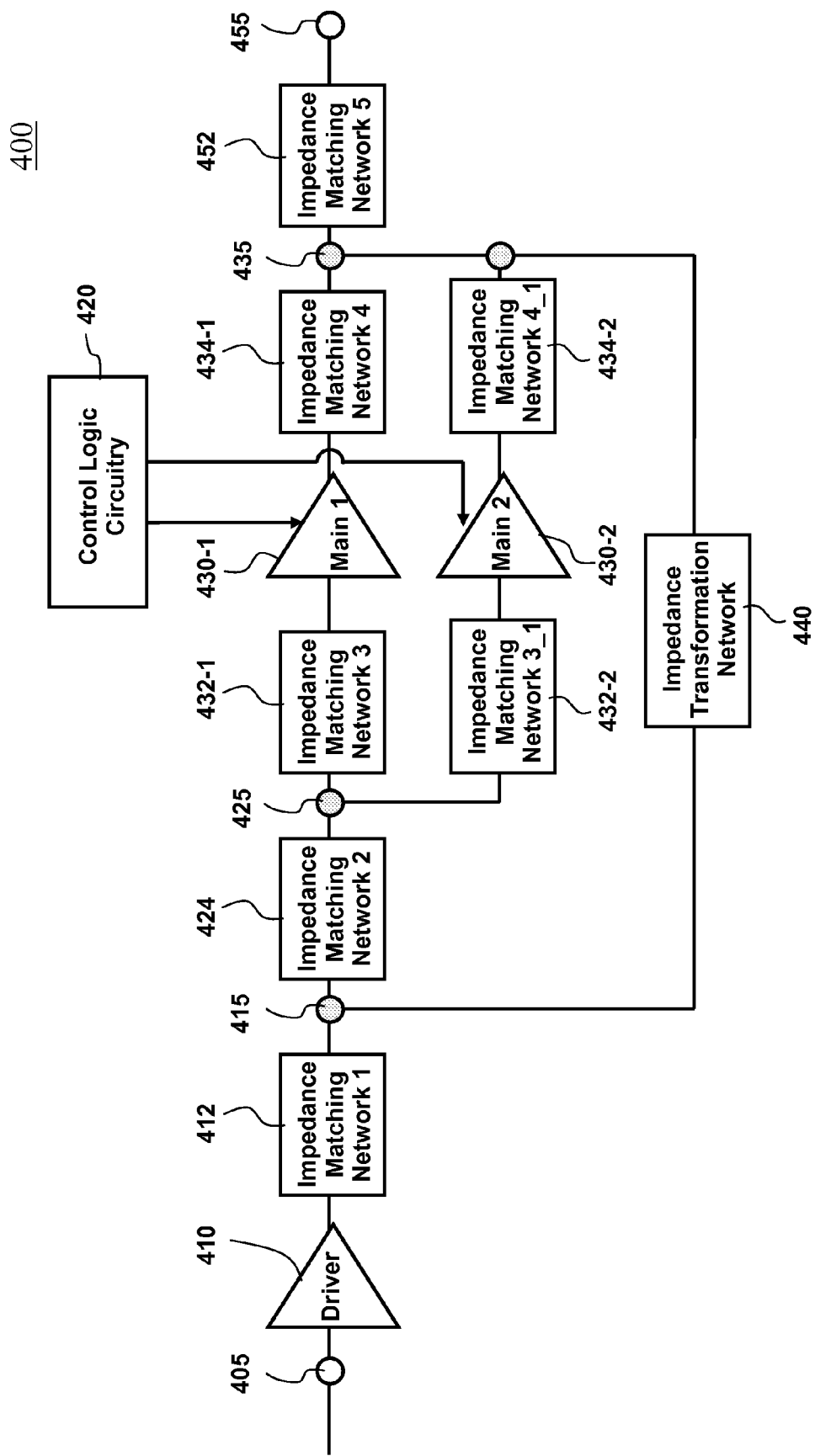
FIG. 4 is a functional block diagram of one embodiment of an amplification device.

FIG. 4 is a functional block diagram of one embodiment of an amplification device 400. Amplification device 400 includes: an input terminal 405; a first impedance matching circuit 412; a second impedance matching circuit 424; a driver amplifier 410; a first main amplifier 430-1; a second main amplifier 430-2; a control logic circuit 420; a third impedance matching circuit 432-1; a fourth impedance matching circuit 432-2; a fifth impedance matching circuit 434-1; a sixth impedance matching circuit 434-2; an impedance transformation network 440; a seventh impedance matching circuit 452; and an output terminal 455.

Driver amplifier 410 has an input terminal, and an output terminal, and the input terminal is connected to input terminal 405. First main amplifier 430-1 has an input terminal and an output terminal, and is configured to receive a first activation signal for selectively activating and deactivating first amplifier 430-1. Second main amplifier 430-2 has an input terminal and an output terminal, and is configured to receive a second activation signal for selectively activating and deactivating the second amplifier. Control logic circuit 420 is configured to supply the first and second activation signals to first and second amplifiers 430-1 and 430-2, respectively. First impedance matching circuit 412 is directly connected between the output terminal of driver amplifier 410 and a first intermediate node 415. Second impedance matching circuit directly 424 is connected between first intermediate node 415 and a second intermediate node 425. Third impedance matching circuit 432-1 is directly connected between second intermediate node 425 and the input terminal of first main amplifier 430-1. Fourth impedance matching circuit 432-2 is directly connected between second intermediate node 425 and the input terminal of second main amplifier 430-2. Fifth impedance matching circuit 434-1 is directly connected between the output terminal of first main amplifier 430-1 and a third intermediate node 435. Sixth impedance matching circuit 434-2 is directly connected between the output terminal of second main amplifier 430-2 and third intermediate node 435. Impedance transformation network 440 is directly connected between first intermediate node 415 and third intermediate node 435. Seventh impedance matching circuit 452 is directly connected between third intermediate node 435 and the output terminal 455.

First main amplifier 430-1, third impedance matching circuit 432-1, and fifth impedance matching circuit 434-1 together may be considered to form a first main amplification branch, and second main amplifier 430-2, fourth impedance matching circuit 432-2, and sixth impedance matching circuit 434-2 together may be considered to form a second main amplification branch. First and second main amplification branches and second impedance matching circuit directly 424 together may be considered to form a main amplification stage which is in parallel with impedance transformation network 440. The parallel combination of the main amplification stage and impedance transformation network 440 may be considered to form a secondary amplification stage.

In some embodiments, the size of first main amplifier 430-1 is greater than the size of second main amplifier 430-2 such that the maximum power output level of first main amplifier 430-1 is greater than the maximum power output level of second main amplifier 430-2. In other embodiments, the size of first main amplifier 430-1 may be about the same as the size of second main amplifier 430-2.

In a beneficial arrangement, first and second activation signals are bias signals for turning on and off first and second main amplifiers 430-1 and 430-2, respectively. As a result, amplification device 400 does not include any switches (e.g., RF switches) in the signal path of a signal that is being amplified by amplification device 400.

In operation, amplification device 400 divides the main amplification stage into two amplification branches so that a power efficiency enhancement can be achieved in the high power regions of amplification device 400. In order to get maximum efficiency at expected output power, the main amplification stage is manipulated by control logic circuit 420, which can be fabricated with HBT, pHEMT, CMOS or any other process. When amplification device 400 operates at its highest power range, both first and second main stage amplifiers 430-1 and 430-2 are turned on by their corresponding activation signals in order to achieve maximum output power and efficiency. In medium power ranges, one of first and second main amplifiers 430-1 and 430-2 is turned off by its corresponding activation signal. The second through sixth impedance matching circuits 424, 432-1, 432-2, 434-1 and 434-2, optimize the load impedance to get higher efficiency at the intended power level. In a low power mode, the main amplification stage is totally deactivated by turning off both first and second main amplifiers 430-1 and 430-2, and the RF signal is delivered from driver amplifier 410 to output terminal 455 through impedance transformer 440, which converts the load impedance to a properly high level so as to accomplish high efficiency in the low power range.

In further detail, Table 1 below illustrates one embodiment of the activation of first and second main stage amplifiers 430-1 and 430-2 in response to the activation signals from control logic circuit 420.

TABLE 1

| Mode | Control Signals | $1^{ST}$ Main Amplifier | $2^{ND}$ Main Amplifier |
|---|---|---|---|
| High Power | 1, 1 | ON | ON |
| High-Medium Power | 1, 0 | ON | OFF |
| Low-Medium Power | 0, 1 | OFF | ON |
| Low Power | 0, 0 | OFF | OFF |

In Table 1, it is implicit that first main stage amplifier 430-1 has a greater maximum output power level than second main stage amplifier 430-2. In an alternative embodiment where the maximum output power levels of first and second main amplifiers 430-1 and 430-2 are the same, then amplification device 400 may only have three operating modes with either one of the other of first and second main amplifiers 430-1 and 430-2 turned on in the medium power mode.

Control logic circuit 420 adjusts the first and second activation signals applied to first and second main amplifiers 430-1 and 430-2 according to one or more exterior control signals input thereto (e.g., from an external circuit in a mobile telephone or other device) corresponding to the desired power mode.

In the low power mode, driver 410 amplifies input power and transfers the amplified power to impedance transformation network 440 through the optimized first impedance matching circuit 412. In contrast, in the high power mode, driver 410 amplifies input power and transfers the amplified power to the main amplification stage through the optimized first impedance matching circuit and the optimized second impedance matching circuit 424.

Accordingly, in the low power mode, since the output power is produced by passing through the optimized first impedance matching circuit 412 and the optimized impedance transformation network 440, instead of the main amplification stage, control logic circuit 420 adjusts the activation signals applied to first and second main stage amplifiers 430-1 and 430-2 to turn them off. This reduces power consumption of amplification device 400.

In contrast, in the high power mode, since output power is increased by passing through first impedance matching circuit 412, second impedance matching circuit 424 and the main amplification stage, control logic circuit 420 adjusts the activation signals applied to first and second main stage amplifiers 430-1 and 430-2 to turn them both on.

First impedance matching unit 412 is a circuit optimized for optimal operations regardless of the operating mode. First impedance matching unit 412 transfers input power amplified by driver 410 to the main amplification stage and impedance transformation network 440, corresponding the operating mode of amplification device 400.

Second impedance matching circuit 424 is a circuit optimized for optimal operations corresponding to the desired operating mode. In the low power mode, second impedance matching circuit 424 routes power, amplified by driver 410 and transferred through first impedance matching circuit 412, to impedance transformation network 440 and in the other modes to the main amplification stage. In the other modes, second impedance matching circuit 424 acts also as an interstage matching circuit, allowing high efficiency power transfer from driver 410 to the main amplification stage. Second impedance matching circuit 424 works in conjunction with first impedance matching circuit 412 and impedance transformation network 440 for this purpose to provide power matching.

Impedance transformation network 440 is an impedance transforming circuit that transforms impedance appropriately corresponding to the low power mode or the other power modes. In the low power mode, impedance transformation network 440 forms a path that bypasses the main amplification stage, so that output of driver 410 is transferred through third intermediate node 435 to output terminal 455 of the amplification device 400.

Output power of driver 410 reaches first intermediate node 415. At first intermediate node 415, the path divides correspondingly to the power modes via first impedance matching circuit 412.

In the low power mode, the main amplification stage is turned completely off by the activation signals applied by control logic circuit 420 to first and second main amplifiers 430-1 and 430-2, and the input impedance of the main amplification stage as viewed from first impedance matching circuit 412 is greater than the input impedance of a path bypassing the main amplification stage as viewed from first impedance matching circuit 412. In a beneficial arrangement, the input impedance of the main amplification stage as viewed from first impedance matching circuit 412 is substantially greater (e.g., at least two times greater, and in some embodiments at least three times greater) than the input impedance of a path bypassing the main amplification stage as viewed from first impedance matching circuit 412.

The design of impedance transformation network 440 is optimized in conjunction with fifth and sixth impedance matching circuits 434-1 and 434-2 and seventh impedance matching circuit 452 to lower the impedance level as viewed from first impedance matching circuit 412 in the low power mode. Thus, in the low power mode, a power signal amplified by driver 410 and transferred to first intermediate node 415 is optimized so that the amount of power inputted into impedance transformation network 440 is significantly or substantially larger than the amount of power inputted into the main amplification stage. The output power signal is transferred to output terminal 455 with minimized power leakage to the main amplification stage by the impedance transforming action of impedance transformation network 440 in conjunction with fifth and sixth impedance matching circuits 434-1 and 434-2 and seventh impedance matching circuit 452.

In the other power modes (e.g., high, medium-high, and medium-low), at least one of the first and second main amplifiers 430-1 and 430-2 of the main amplification stage is on, in response to a corresponding activation signal applied by control logic circuit 420. In that case, the input impedance of the main amplification stage as viewed from first impedance matching circuit 412 is less than the input impedance of a path bypassing the main amplification stage (i.e., via impedance transformation network 440) as viewed from first impedance matching circuit 412. Impedance transformation network 440 is optimally designed in conjunction with fifth and sixth impedance matching circuits 434-1 and 434-2 and seventh impedance matching circuit 452 such that in the power modes other than the low power mode, the input impedance of the bypass path is greater than the input impedance of the main amplification stage. Second impedance matching circuit 424 is designed to boost up the impedance level as viewed from first impedance matching circuit 412 while providing interstage matching in the these power modes. Thus, most power, amplified by driver 410 and transferred to first intermediate node 415, is amplified by the main amplification stage and is transferred to output terminal 455 of amplification device 400, while minimizing power leakage to impedance transformation network 440 by the optimized fifth and sixth impedance matching circuits 434-1 and 434-2 and the optimized fourth impedance matching unit 160.

The input impedance of a path bypassing the main amplification stage as viewed from first impedance matching circuit 412 forms an interstage matching unit between driver 410 and the main amplification stage together with first impedance matching circuit 412 in the power modes other than the low power mode, so that output power of driver 410 is well transferred to the main amplification stage without power reflections.

In a beneficial arrangement, in these power modes the input impedance of the bypass path as viewed from first impedance matching circuit 412 is substantially greater (e.g., at least two times greater, and in some embodiments at least three times greater) than the input impedance of the main amplification stage as viewed from first impedance matching circuit 412.

Figure 5:
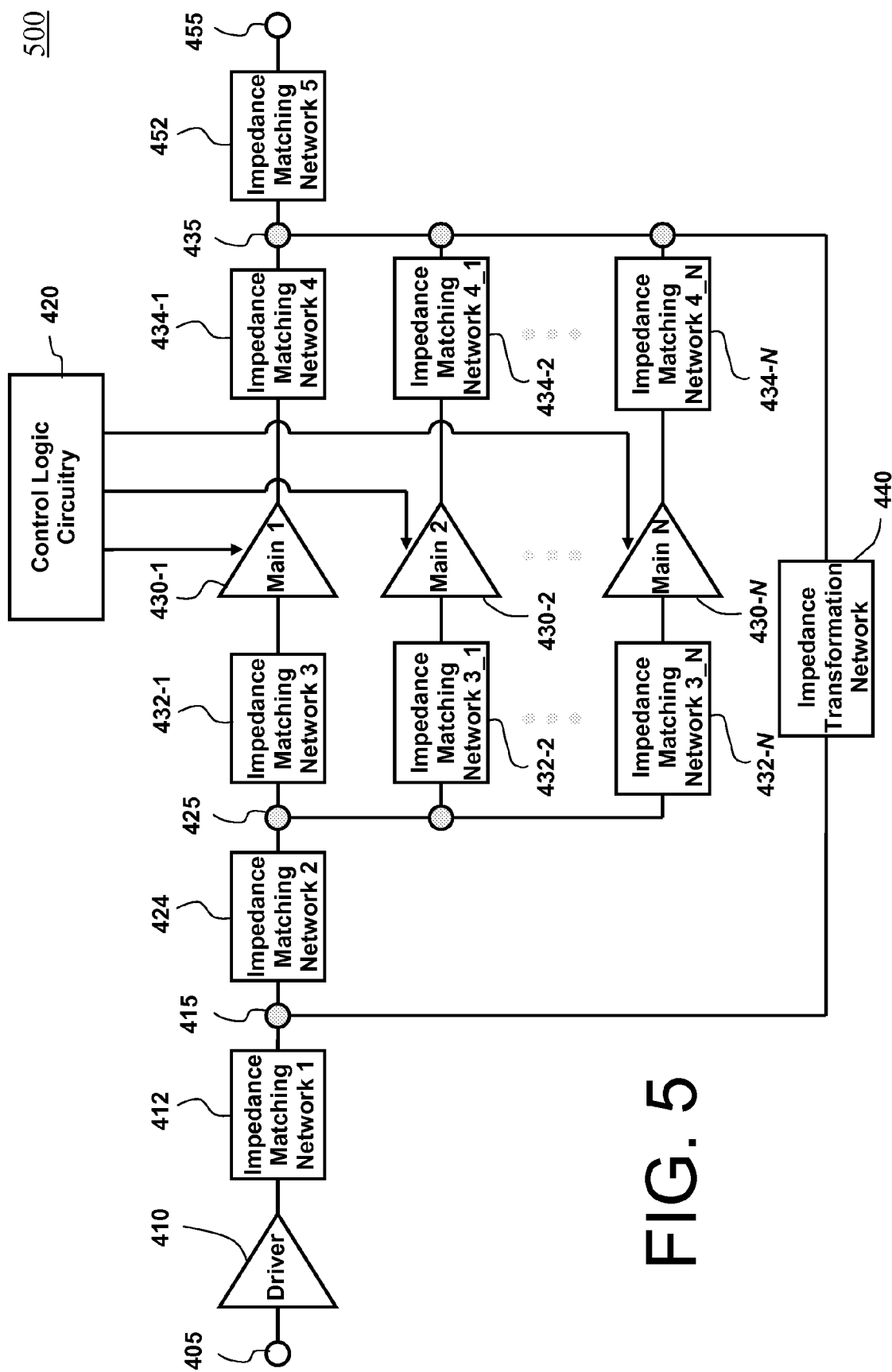
FIG. 5 is a functional block diagram of another embodiment of an amplification device.

FIG. 5 is a functional block diagram of another embodiment of an amplification device 500.

Amplification device 500 is a generalized extension of amplification device 400. In amplification device 500, the main amplification stage includes a total of N main amplification branches, where N>2. The Nth main amplification branch includes Nth main amplifier 430-N, impedance matching circuit 432-N, and impedance matching circuit 434-N.

Amplification device 500 can provide additional power efficiency enhancement by employing more than two operating modes in the high power range. The main amplification stage can have as many amplification stages as desired and provide as many power modes as desired, with the combination of main amplification branches that are turned "on" determined by the activation signals supplied by control logic circuit 420. The impedance matching circuits for each main amplification branch are designed appropriately so that the load impedance is optimized for each operating mode, thereby enhancing the efficiency of amplification device 500.

Otherwise, the operation of amplification device 500 is similar to that of amplification device 400, and so a detailed description thereof will not be repeated.

Figure 6:
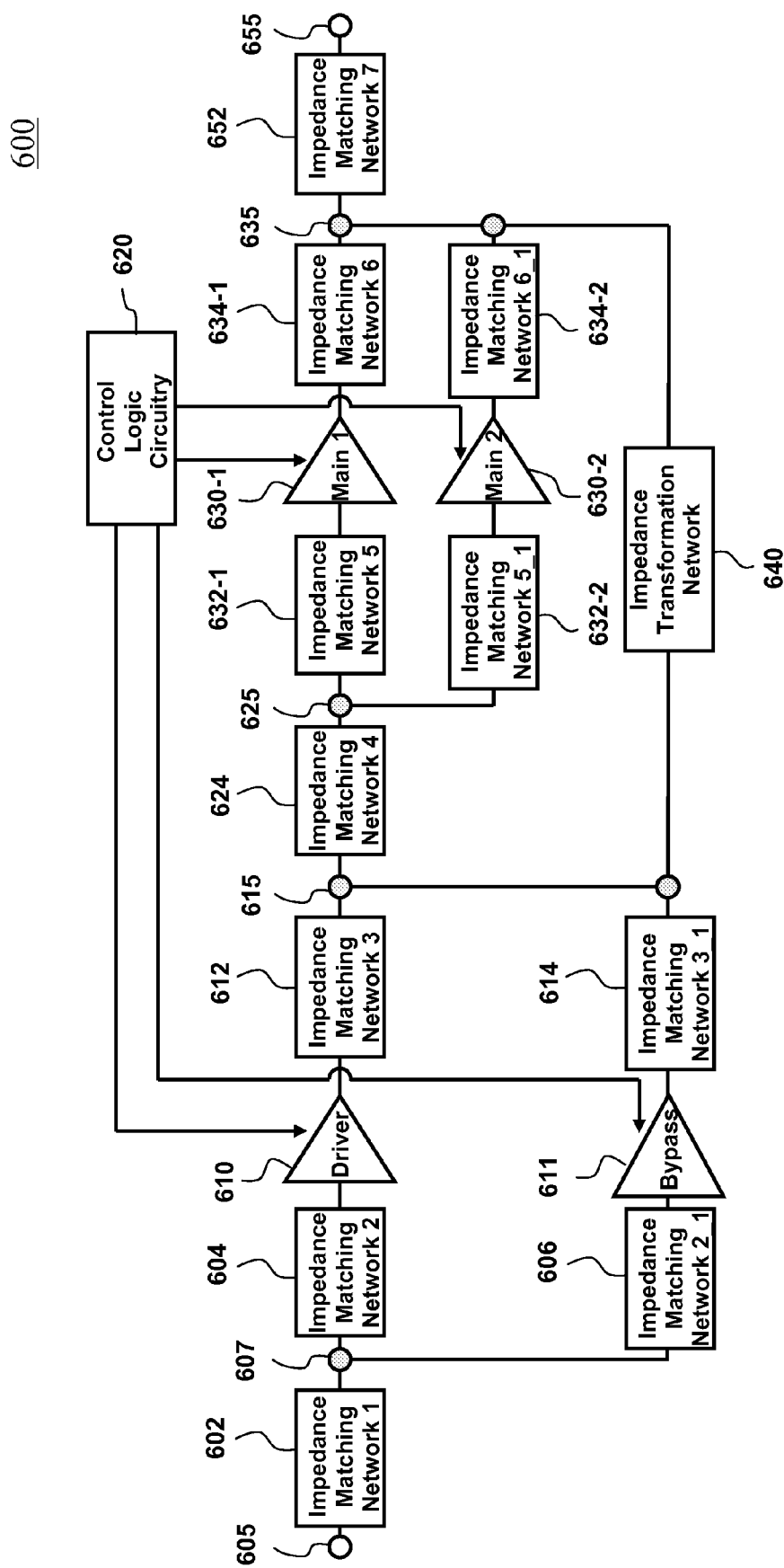
FIG. 6 is a functional block diagram of still another embodiment of an amplification device.

FIG. 6 is a functional block diagram of still another embodiment of an amplification device 600. Amplification device 600 includes: an input terminal 605; a first impedance matching circuit 602; a second impedance matching circuit 604; a third impedance matching circuit 606; a driver amplifier 610; a bypass amplifier 611; a control logic circuit 620; a fourth impedance matching circuit 612; a fifth impedance matching circuit 614; a sixth impedance matching circuit 624; a first main amplifier 630-1; a second main amplifier 630-2; a seventh impedance matching circuit 632-1; an eighth impedance matching circuit 632-2; a ninth impedance matching circuit 634-1; a tenth impedance matching circuit 634-2; an impedance transformation network 640; and an eleventh impedance matching circuit 652; and an output terminal 655.

First impedance matching circuit 602 is directly connected between the input terminal 605 and a first intermediate node 607. Driver amplifier 610 has an input terminal, and an output terminal, and is configured to receive a driver amplifier activation signal for selectively activating and deactivating driver amplifier 610. Bypass amplifier 611 has an input terminal, and an output terminal, and is configured to receive a bypass amplifier activation signal for selectively activating and deactivating bypass amplifier 611. Second impedance matching circuit 604 is directly connected between the first intermediate node 607 and the input node of the driver amplifier 610. Third impedance matching circuit 606 is directly connected between the first intermediate node 607 and the input node of the bypass amplifier 611. First main amplifier 630-1 has an input terminal and an output terminal, and is configured to receive a first activation signal for selectively activating and deactivating the first main amplifier 630-1. Second main amplifier 630-2 has an input terminal and an output terminal, and is configured to receive a second activation signal for selectively activating and deactivating second main amplifier 630-2. Control logic circuit 620 is configured to supply the driver amplifier activation signal to the driver amplifier 610, to supply the bypass amplifier activation signal to the bypass amplifier 611, and to supply the first and second activation signals to the first and second main amplifiers 630-1 and 630-2, respectively. Fourth impedance matching circuit 612 is directly connected between the output terminal of driver amplifier 610 and a second intermediate node 615. Fifth impedance matching circuit 614 is directly connected between the output terminal of bypass amplifier 611 and second intermediate node 615. Sixth impedance matching circuit 624 is directly connected between second intermediate node 615 and a third intermediate node 625. Seventh impedance matching circuit 632-1 is directly connected between third intermediate node 625 and the input terminal of first main amplifier 630-1. Eighth impedance matching circuit 632-2 is directly connected between third intermediate node 625 and the input terminal of second main amplifier 630-2. Ninth impedance matching circuit 634-1 is directly connected between the output terminal of first main amplifier 630-1 and a fourth intermediate node 635. Tenth impedance matching circuit 634-2 is directly connected between the output terminal of second main amplifier 630-2 and fourth intermediate node 635. Impedance transformation network 640 is directly connected between second intermediate node 615 and fourth intermediate node 635. Eleventh impedance matching circuit 652 is directly connected between fourth intermediate node 635 and output terminal 655.

A primary distinction between amplification device 600 and amplification device 400 is that the structure has additional small size bypass amplifier 611, which is activated instead of driver amplifier 610 by control logic circuit 620 at a much lower power range, so that significant quiescent current reduction would be achieved.

Otherwise, the operation of amplification device 600 is similar to that of amplification device 400, and so a detailed description thereof will not be repeated.

Figure 7:
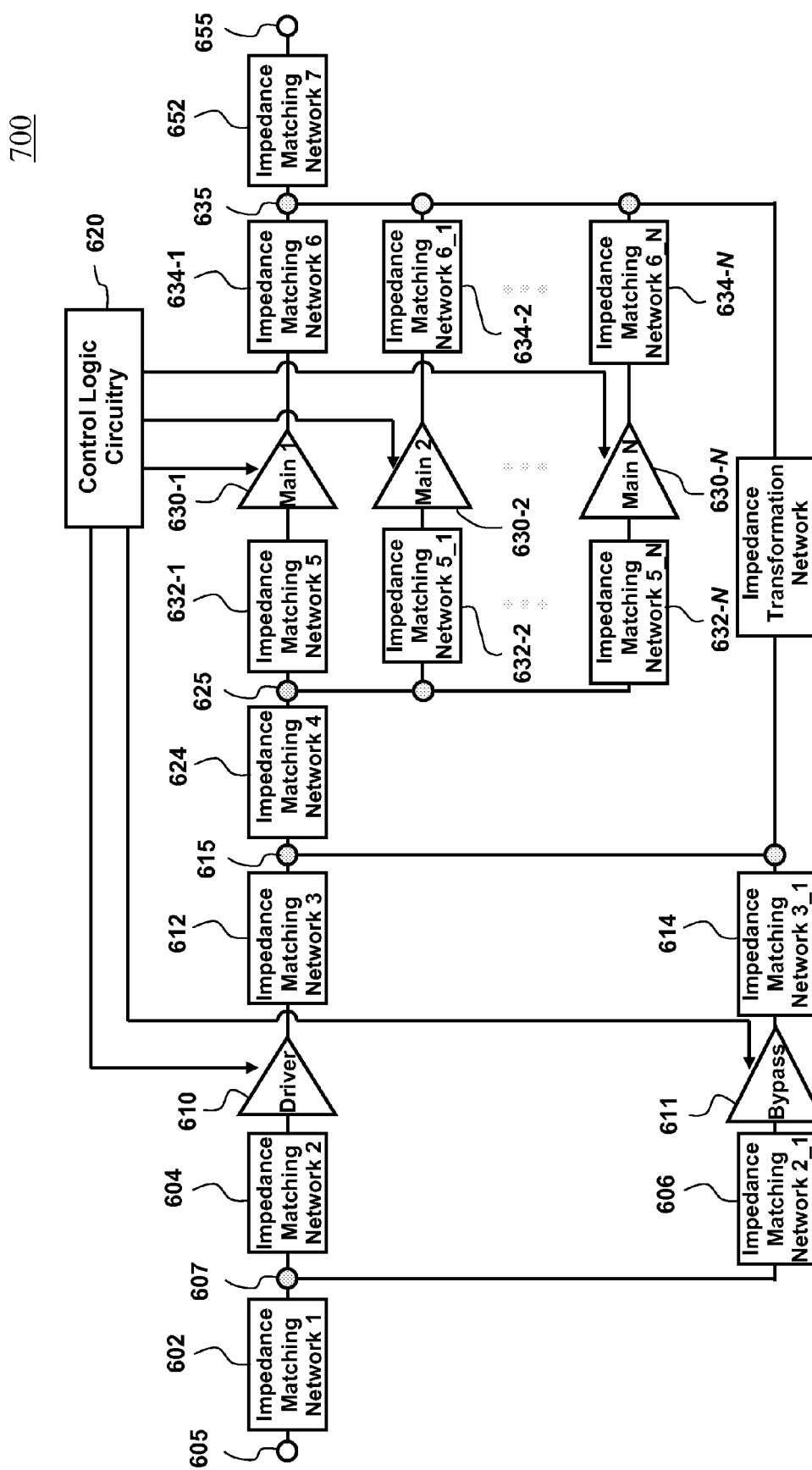
FIG. 7 is a functional block diagram of yet another embodiment of an amplification device.

FIG. 7 is a functional block diagram of yet another embodiment of an amplification device 700. Amplification device 700 is a generalized extension of amplification device 600. In amplification device 600, the main amplification stage includes a total of N main amplification branches, where N>2. The Nth main amplification branch includes Nth main amplifier 630-N, impedance matching circuit 632-N, and impedance matching circuit 634-N.

Amplification device 700 can provide additional power efficiency enhancement by employing more than two operating modes in the high power range. The main amplification stage can have as many amplification stages as desired and provide as many power modes as desired, with the combination of main amplification branches that are turned "on" determined by the activation signals supplied by control logic circuit 620. The impedance matching circuits for each main amplification branch are designed appropriately so that the load impedance is optimized for each operating mode, thereby enhancing the efficiency of amplification device 700.

Otherwise, the operation of amplification device 700 is similar to that of amplification device 600, and so a detailed description thereof will not be repeated.

Figure 8:
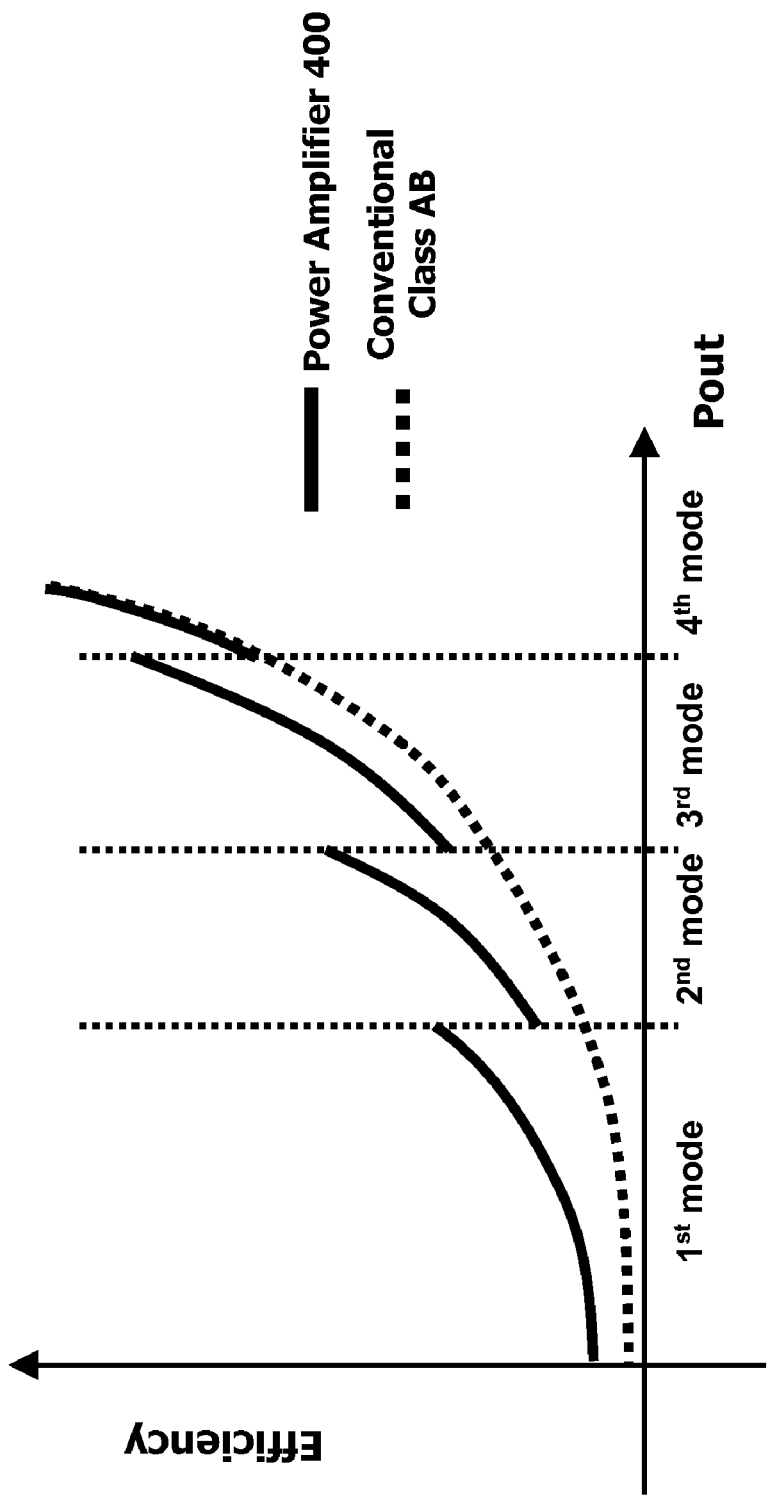
FIG. 8 plots the efficiency versus output power for a class AB amplifier, and an amplification device such as that illustrated in FIG. 4.

FIG. 8 plots efficiency versus output power for a standard class AB amplifier, and an amplification device such as that illustrated in FIG. 4. Compared with a standard class AB amplifier which had normal tendency of RF power efficiency, an amplification device according to FIG. 4 can increase the efficiency in both the low and the high power regions without degradation of overall performance.

Amplification devices as described above include discrete power modes in the high output power region as well as the low power region. In contrast with previous amplification devices which have separated power modes only either more than 10 dB below the maximum output power level or the high power region, amplifications devices described herein can provide power modes both in a region just backed off by about 3 to 6 dB from maximum power, and in a lower power region more than 10 dB below the maximum output power. By adding an extra power mode in the high power region, amplification devices can improve their efficiency in the region of interest. As a result, a significant increase in the battery life and accompanying operating time can be accomplished for a mobile device for applications which has a greater portion of its probability density function in a high power region, such as EDGE signal.

As an accompanying result of this invention, a single module which has its maximum power efficiency with several power ranges can be accomplished for different applications which require various maximum power levels, such as pairs of linear GSM and CDMA, WCDMA and WLAN and so on.

Since this work has been realized without using additional RF switches or complicated phase delay circuits, redundant power loss and complexity are avoided. In addition, complete activation of main stages at the highest power region possibly reduces MMIC die size, thereby saves production cost. This invention would derive higher performance and production profits than other works and therefore help to satisfy better level of standard.

While example embodiments are disclosed herein, one of ordinary skill in the art appreciates that many variations that are in accordance with the present teachings are possible that remain within the scope of the appended claims. The embodiments therefore are not to be restricted except within the scope of the appended claims.

The invention claimed is:

1. A device, comprising:
an input terminal;
an output terminal;
a driver amplifier having an input terminal, and an output terminal, where the input terminal is connected to the input terminal;
a first main amplifier having an input terminal and an output terminal, and configured to receive a first activation signal for selectively activating and deactivating the first amplifier;
a second main amplifier having an input terminal and an output terminal, and configured to receive a second activation signal for selectively activating and deactivating the second amplifier;
a control circuit configured to supply the first and second activation signals to the first and second amplifiers, respectively;
a first impedance matching circuit directly connected between the output terminal of the driver amplifier and a first intermediate node;
a second impedance matching circuit directly connected between the first intermediate node and a second intermediate node;
a third impedance matching circuit directly connected between the second intermediate node and the input terminal of the first main amplifier;
a fourth impedance matching circuit directly connected between the second intermediate node and the input terminal of the second main amplifier;
a fifth impedance matching circuit directly connected between the output terminal of the first main amplifier and a third intermediate node;
a sixth impedance matching circuit directly connected between the output terminal of the second main amplifier and the third intermediate node;
an impedance transformation network directly connected between the first intermediate node and the third intermediate node; and
a seventh impedance matching circuit directly connected between the third intermediate node and the output terminal.

2. The device of claim 1, further comprising:
a third main amplifier having an input terminal and an output terminal, and configured to receive a third activation signal for selectively activating and deactivating the third amplifier;
an eighth impedance matching circuit directly connected between the second intermediate node and the input terminal of the third main amplifier; and
a ninth impedance matching circuit directly connected between the output terminal of the third main amplifier and the third intermediate node.

3. The device of claim 1, wherein the first and second activation signals are bias signals for turning on and off the first and second main amplifiers, respectively.

4. The device of claim 1, wherein the first and second activation signals are configured in at least one operating mode to turn on both the first and second main amplifiers at a same time.

5. The device of claim 1, wherein the first and second main amplifiers are each biased to operate in class AB amplification mode.

6. A device, comprising:
an input terminal;
an output terminal;
a first impedance matching circuit directly connected between the input terminal and a first intermediate node;
a driver amplifier having an input terminal, and an output terminal, and configured to receive a driver amplifier activation signal for selectively activating and deactivating the driver amplifier;
a bypass amplifier having an input terminal, and an output terminal, and configured to receive a bypass amplifier activation signal for selectively activating and deactivating the bypass amplifier;
a second impedance matching circuit directly connected between the first intermediate node and the input node of the driver amplifier;
a third impedance matching circuit directly connected between the first intermediate node and the input node of the bypass amplifier;
a first main amplifier having an input terminal and an output terminal, and configured to receive a first activation signal for selectively activating and deactivating the first main amplifier;
a second main amplifier having an input terminal and an output terminal, and configured to receive a second activation signal for selectively activating and deactivating the second main amplifier;
a control circuit configured to supply the driver amplifier activation signal to the driver amplifier, to supply the bypass amplifier activation signal to the bypass amplifier, and to supply the first and second activation signals to the first and second main amplifiers, respectively;
a fourth impedance matching circuit directly connected between the output terminal of the driver amplifier and a second intermediate node;
a fifth impedance matching circuit directly connected between the output terminal of the bypass amplifier and the second intermediate node;
a sixth impedance matching circuit directly connected between the second intermediate node and a third intermediate node;
a seventh impedance matching circuit directly connected between the third intermediate node and the input terminal of the first main amplifier;
an eighth impedance matching circuit directly connected between the third intermediate node and the input terminal of the second main amplifier;
a ninth impedance matching circuit directly connected between the output terminal of the first main amplifier and a fourth intermediate node;

a tenth impedance matching circuit directly connected between the output terminal of the second main amplifier and the fourth intermediate node;

an impedance transformation network directly connected between the second intermediate node and the fourth intermediate node; and an eleventh impedance matching circuit directly connected between the fourth intermediate node and the output terminal.

7. The device of claim 6, further comprising:

a third main amplifier having an input terminal and an output terminal, and configured to receive a third activation signal for selectively activating and deactivating the third amplifier;

a twelfth impedance matching circuit directly connected between the third intermediate node and the input terminal of the third main amplifier; and a thirteenth impedance matching circuit directly connected between the output terminal of the third main amplifier and the fourth intermediate node.

8. The device of claim 6, wherein the first and second activation signals are bias signals for turning on and off the first and second main amplifiers, respectively.

9. The device of claim 6, wherein the first and second activation signals are configured in at least one operating mode to turn on both the first and second main amplifiers at a same time.

10. The device of claim 6, wherein the first and second main amplifiers are each biased to operate in class AB amplification mode.

11. The device of claim 6, wherein the driver amplifier activation signal is a bias signal for turning on and off the driver amplifier, and the bypass amplifier activation signal is a bias signal for turning on and off the bypass amplifier.

12. A device for amplifying a signal, comprising:

a driver amplifier stage including a driver amplifier and a driver amplifier output matching network;

a device output terminal matching network;

a secondary amplification stage in series between the driver amplifier stage and the device output terminal matching network, wherein the secondary amplification stage comprises, an impedance transformation network, and a main amplification stage in parallel with the impedance transformation network, wherein the main amplification stage includes a plurality of main amplification branches in parallel with each other, wherein each of the main amplification branches includes a main amplifier, an input impedance matching network, and an output impedance matching network, and a main amplification stage input matching network in series with the plurality of parallel main amplification branches; and a control circuit configured to supply activation signals to each of the main amplification branches to selectively turn on and off the main amplification branches;

wherein the device has no switches in the path of the signal that is amplified, and wherein in at least one operating mode, the control circuit is configured to turn on at least two of the main amplification branches at a same time.

13. The device of claim 12, wherein the plurality of main amplification branches includes at least three main amplification branches.

14. The device or claim 12, further comprising:

a bypass amplifier stage in parallel with the driver amplifier stage, the bypass amplifier stage including a bypass amplifier, a bypass amplifier input matching network, and a bypass amplifier output matching network; and a device input terminal matching network, wherein the driver amplifier stage further comprises a driver amplifier stage input matching network, and wherein the device input matching network is connected to the driver amplifier stage input matching network and the bypass amplifier stage input matching network.

15. The device of claim 12, wherein the activation signals are bias signals for turning on and off the amplifiers in the main amplification branches.

16. The device of claim 12, wherein each of the main amplifiers is biased to operate in class AB amplification mode.

* * * * *